(12) United States Patent
Joo

(10) Patent No.: US 8,017,950 B2
(45) Date of Patent: Sep. 13, 2011

(54) ORGANIC ELECTRO-LUMINESCENCE DISPLAY DEVICE AND METHOD OF MANFACTURING THE SAME

(75) Inventor: In Su Joo, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 1075 days.

(21) Appl. No.: 11/639,326

(22) Filed: Dec. 15, 2006

(65) Prior Publication Data

US 2007/0152222 A1    Jul. 5, 2007

(30) Foreign Application Priority Data

Dec. 29, 2005 (KR) .......................... 10-2005-0133194
Dec. 29, 2005 (KR) .......................... 10-2005-0134252

(51) Int. Cl.
*H01L 29/08* (2006.01)

(52) U.S. Cl. ........................... 257/72; 257/40

(58) Field of Classification Search .................... 257/40, 257/72; 313/512, 504
See application file for complete search history.

(56) References Cited

U.S. PATENT DOCUMENTS

| | | | | |
|---|---|---|---|---|
| 7,309,955 B2* | 12/2007 | Kim | ............................... | 313/500 |
| 2004/0165120 A1* | 8/2004 | Woo et al. | ........................ | 349/42 |
| 2005/0139841 A1* | 6/2005 | Park | ................................ | 257/79 |
| 2005/0161740 A1* | 7/2005 | Park et al. | ..................... | 257/347 |
| 2006/0055313 A1* | 3/2006 | Bae et al. | ...................... | 313/500 |
| 2006/0292888 A1* | 12/2006 | Park et al. | ..................... | 438/754 |
| 2008/0136323 A1* | 6/2008 | Park | ............................... | 313/504 |

FOREIGN PATENT DOCUMENTS

CN    1516530    7/2004

* cited by examiner

*Primary Examiner* — Matthew Smith
*Assistant Examiner* — Christine Enad
(74) *Attorney, Agent, or Firm* — McKenna Long & Aldridge LLP

(57) ABSTRACT

Provided is an organic electro-luminescence display device. Because TFTs and organic light-emitting diode devices are formed on two different substrates, respectively, and the two substrates are attached to each other, so that productivity improves and manufacturing costs can be reduced. Also, because a pad portion exposed to the outside is formed using a conductive layer having corrosion resistance, corrosion of the pad portion is prevented, and thus an organic electro-luminescence display device having improved reliability can be provided.

33 Claims, 12 Drawing Sheets

ORGANIC ELECTRO-LUMINESCENCE DISPLAY DEVICE AND METHOD OF MANFACTURING THE SAME

The present disclosure relates to subject matter contained in priority Korean Application Nos. 2005-133194 and 2005-134252, both filed on Dec. 29, 2005, which are incorporated by reference for all purposes as if fully incorporated herein.

BACKGROUND OF THE INVENTION

1. Field of the Invention

The present invention relates to an organic electro-luminescence display device, and more particularly, to a dual panel-type organic electro-luminescence display device capable of achieving reliability and a method for manufacturing the same.

2. Description of the Related Art

An organic electro-luminescence display device uses a phenomenon that carriers such as electrons and holes create electron-hole pairs or carriers are excited to a higher energy state and then fall down to a ground state, which is a stable state, inside a semiconductor to generate light.

Since the organic electro-luminescence display device is a self-luminous type display device and thus does not require a backlight unit as in a liquid crystal display (LCD) device, it can be manufactured in lightweight and a slim profile. Also, the organic electro-luminescence display device has advantages of low voltage driving, a high light-emitting efficiency, a wide viewing angle, and a fast response time, and is advantageous in realizing a high quality moving image.

Particularly, unlike an LCD device or a plasma display panel (PDP), deposition and encapsulation equipment occupy most of the manufacturing process of the organic electro-luminescence display device, thus the manufacturing process is very simple.

Also, in the case where the organic electro-luminescence display device is driven using an active matrix in which each pixel has a thin film transistors (TFT), which is a switching device, same brightness is achieved even when a low current is applied, so that low power consumption, high definition, and a large size can be realized.

FIG. 1 is a schematic cross-sectional view of an organic electro-luminescence display device according to a related art. Referring to FIG. 1, a TFT Tr is formed on the substrate 10. The TFT includes a gate electrode 15, an active layer 25, and source/drain electrodes 27a and 27b.

The substrate 10 includes a passivation layer 20 having a contact hole exposing a portion of the drain electrode 27b.

A first electrode 30 is formed on the passivation layer 20, and electrically connected to the drain electrode 27b via the contact hole.

An insulating layer 40 where a pixel region is defined is located on the passivation layer 20. An organic luminescence layer 50 is disposed on a portion of the first electrode 30 that corresponds to the pixel region. A second electrode 60, which is a common electrode, is disposed on the organic luminescence layer 50.

Here, the first and second electrodes 30 and 60 apply a forward current on the organic luminescence layer 50 to allow the organic luminescence layer 50 to emit light.

After that, after sealant 70 is coated on an outer edge of the substrate 10 in order to protect the organic light-emitting diode device E formed on the substrate 10 from external humidity and oxygen, an encapsulating substrate 80 facing the organic light-emitting diode device E is attached, so that the organic electro-luminescence display device is manufactured. The organic electro-luminescence display device is classified into a bottom-emission type organic electro-luminescence display device and a top-emission type organic electro-luminescence display device depending on an emitting direction of an image.

The bottom-emission type organic electro-luminescence display device has a disadvantage that it is difficult to apply the display device to a high resolution product due to limitations in an aperture ratio.

On the other hand, the top-emission type organic electro-luminescence display device has an advantage in an aspect of a product growth in that designing a TFT is easy and an aperture ratio can be improved.

However, since a cathode is generally located on an organic light-emitting layer in a top-emission type organic electro-luminescence display device according to a related art, a material of an electrode is difficult to select. Accordingly, transmittance is limited and a light efficiency reduces.

Also, in the top-emission type organic electro-luminescence display device according to a related art, a pad portion for receiving a signal from an outside is exposed to the outside. The pad portion is formed of metal and easily corroded by external oxygen and moisture.

The corrosion of the pad portion increases contact resistance between metal of the pad portion and contact metal of an external circuit unit to generate a dark pixel. Furthermore, the corrosion of the pad portion may reduce reliability of the organic electro-luminescence display device.

SUMMARY OF THE INVENTION

Accordingly, the present invention is directed to an organic electro-luminescence display device and a method for manufacturing the same that substantially obviate one or more problems due to limitations and disadvantages of the related art.

An object of the present invention is to provide an organic electro-luminescence display device capable of increasing a production and error rate management efficiency and improving a light efficiency and reliability by forming TFTs and organic light-emitting diode devices such that yields of them do not have an influence on the other elements.

Another object of the present invention is to provide a method for manufacturing an organic electro-luminescence display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic electro-luminescence display device including: a first substrate having a first region and a second region defined thereon; a gate line formed on a portion of the first substrate that corresponds to the first region, and a gate pad extending from the gate line and formed on the second region; a data pad extending to the first and second regions of the first substrate; a gate insulating layer formed on the gate line, the gate pad, and the data pad; a data line disposed on the gate insulating layer and crossing the gate line, and a data pad link portion located at an end of the data line; at least one thin film transistor formed on an intersection of the gate line and the data line; a passivation layer including a contact hole exposing portions of the thin film transistor, the data pad, the gate pad, and the data pad link portion; and a link line disposed on the passivation layer to electrically connect the data pad with the data pad link portion.

In another aspect of the present invention, there is provided a method for manufacturing an organic electro-luminescence display device, the method including: providing a first substrate; sequentially stacking a first conductive layer and a second conductive layer on the first substrate and patterning the first and second conductive layers to form a gate electrode, a gate line, a gate pad, and a data pad; forming a gate insulating layer on the gate electrode, the gate line, the gate pad, and the data pad; forming an active layer, source/drain electrodes, a data line, and a data pad link portion on a portion of the gate insulating layer that corresponds to the gate electrode; forming a passivation layer on the gate insulating layer including the active layer, the source/drain electrodes, the data line, and the data pad link portion; forming a contact hole exposing portions of the drain electrode, the data pad link portion, the gate pad, and the data pad on the passivation layer; and forming a link line for connecting the data pad with the data pad link portion.

In still further aspect of the present invention, there is provided an organic electro-luminescence display device including: a first substrate; a gate line located on the first substrate, and a gate pad link portion formed at an end of the gate line; a gate insulating layer formed on the first substrate including the gate line and the gate pad link portion; a data line formed by stacking at least first conductive patterns and second conductive patterns on the gate insulating layer, a data pad located at an end of the data line, and a gate pad separated from the data line; a passivation layer formed on the data line, the data pad, and the gate pad, and including a contact hole exposing portions of the gate pad link portion, the data pad, and the gate pad; and a link line located on the passivation layer to electrically connect the gate pad link portion with the gate pad, wherein the first conductive patterns are formed of a conductive material having corrosion resistance.

In yet further another aspect of the present invention, there is provided a method for manufacturing an organic electro-luminescence display device, the method including: providing a first substrate; after forming a conductive layer on the first substrate, patterning the conductive layer to form a gate electrode, a gate line, and a gate pad link portion; forming a gate insulating layer on the gate electrode, the gate line, and the gate pad link portion; forming an active layer on a portion of the gate insulating layer that corresponds to the gate electrode; after sequentially forming a first conductive layer and a second conductive layer on the gate insulating layer including the active layer, patterning the first and second conductive layers to simultaneously form source/drain electrodes located in corresponding regions of the active layer, and a data line, a gate pad, and a data pad located on the gate insulating layer; forming a passivation layer on the active layer, the source/drain electrodes, the data line, the gate pad, and the data pad; forming a contact hole exposing portions of the drain electrode, the gate pad link portion, the gate pad, and the data pad in the passivation layer; and forming a link line for connecting the gate pad with the gate pad link portion on the passivation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
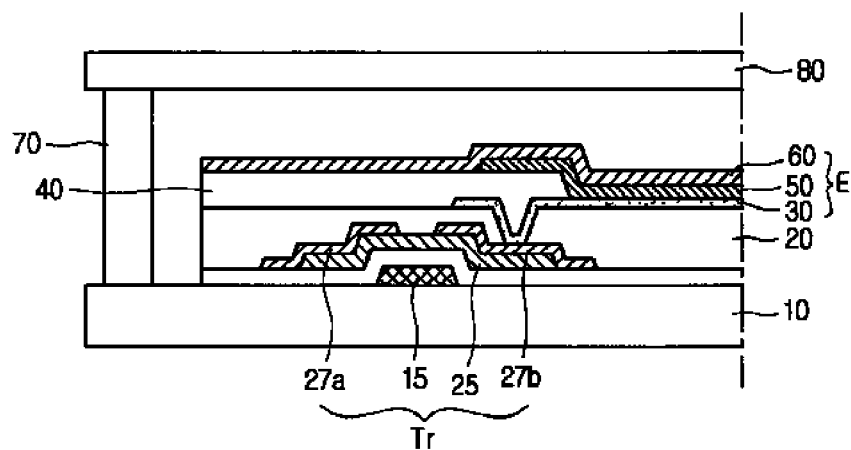
FIG. 1 is a schematic cross-sectional view of an organic electro-luminescence display device according to a related art.

Reference will now be made in detail to embodiments of the present invention, examples of which are illustrated in the accompanying drawings. The embodiments below are provided as examples to sufficiently deliver the spirit of the present invention to a person of ordinary skill in the art. Therefore, the present invention is not limited to the embodiment, and the scope of the invention is intended to encompass the variety of modification and forms understood to one of ordinary skill in the art. In the drawings, the size and thickness of a device can be exaggerated for clarity. Wherever possible, the same reference numbers will be used throughout the drawings to refer to the same or like parts.

First Embodiment

Figure 2:
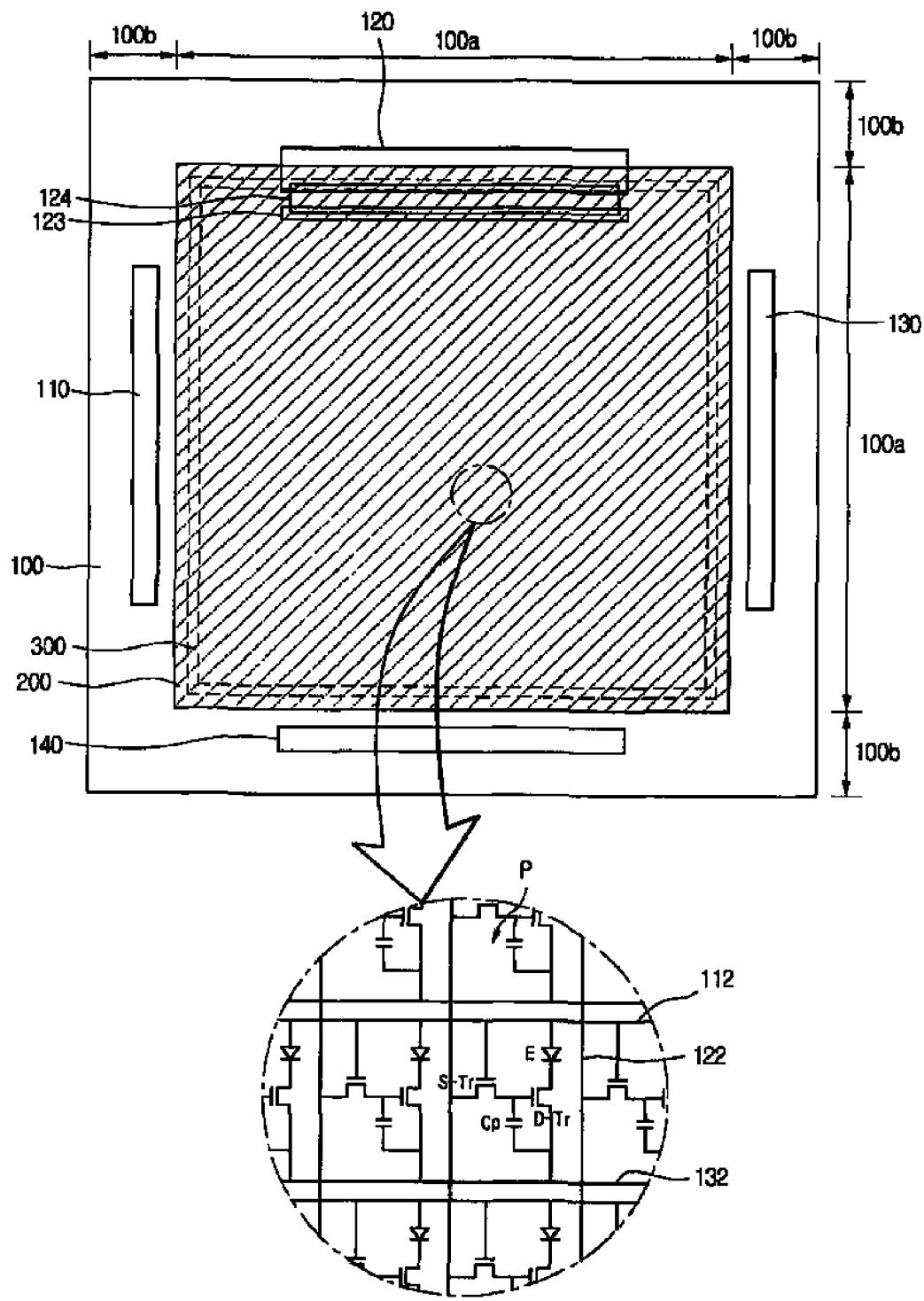
FIG. 2 is a schematic plan view of an organic electro-luminescence display device according to a first embodiment of the present invention.

FIG. 2 is a schematic plan view of an organic electro-luminescence display device according to a first embodiment of the present invention.

Referring to FIG. 2, a first substrate 100 and a second substrate 200 are attached to each other using sealant patterns 300.

The first substrate 100 is defined as an active region 100a and a peripheral region 100b disposed along edges of the active region 100a. The active region 100a includes a plurality of gate lines 112 and data lines 122 crossing each other. Also, the active region 100a further includes a power line 132 disposed parallel to the gate line 112.

A pixel region P is formed in a portion surrounded by the gate line 112 and the data line 122. A thin film transistor (TFT) is disposed in the pixel region P. For example, a switching TFT S-Tr, a driving TFT D-Tr, and a capacitor Cp are arranged in the pixel region P. The switching TFT S-Tr is electrically connected to the gate line 112 and the data line 122. The driving TFT D-Tr is electrically connected to the switching TFT S-Tr and the capacitor Cp. Also, a source electrode of the driving transistor D-Tr is electrically connected to the power line 132.

Also, a data pad link portion 123 and a link line 124 are disposed in the active region 100a. The data pad link portion 123 is formed at an end of the data line 122, and the link line 124 is connected to the data pad link portion 123.

Also, a data pad 120 extends to the active region 100a and the peripheral region 100b and is electrically connected to the link line 124.

A gate pad 110 and a ground pad 130 can be disposed in the peripheral region 100b. The gate pad 110 is formed at an end of the gate line 112, and the ground pad 130 is formed at an end of the power line 132.

Also, a common voltage pad 140 is disposed in the peripheral region 100b. The common voltage pad 140 receives a common voltage from an external circuit part. The common voltage pad 140 is electrically connected to the organic light-emitting diode device E formed on the second substrate 200.

The pad portion located to correspond to the peripheral region 100b is connected to an external circuit part such as a tape-carrier package (TCP) and a flexible printed circuit (FPC) to receive an external signal.

Meanwhile, an organic light-emitting diode device E is formed on an inner side of the second substrate 200 and connected to the TFT formed on the first substrate 100.

The organic electro-luminescence display device having the above construction is driven as described below.

The external circuit part applies a selection signal and a data signal to the gate pad 110 and the data pad 120, respectively. When the selection signal turns on a gate electrode of the switching TFT S-Tr via the gate line connected to the gate pad 110, the data signal passes through the switching TFT S-Tr via the data line 122 connected to the data pad 120, and is applied to the drive TFT D-Tr and the capacitor Cp.

The data signal turns on a gate electrode of the drive TFT D-Tr to supply a current to the organic light-emitting diode device E via the drive TFT D-Tr. When a current flows through the organic light-emitting diode device E, holes and electrons are supplied from an anode and a cathode, respectively, to an organic light-emitting layer. After that, holes and electrons recombine in the organic light-emitting layer to generate energy and realize an image.

At this point, it is possible to control an amount of a current flowing through the drive TFT D-Tr by controlling on/off states of the drive TFT D-Tr in response to the data signal, in order to display a gray scale.

Also, when a selection signal is not applied, a data signal charged in the capacitor Cp is applied to the drive TFT D-Tr to allow the organic light-emitting diode device E to constantly emit light until a signal of a next image is applied.

Figure 3:
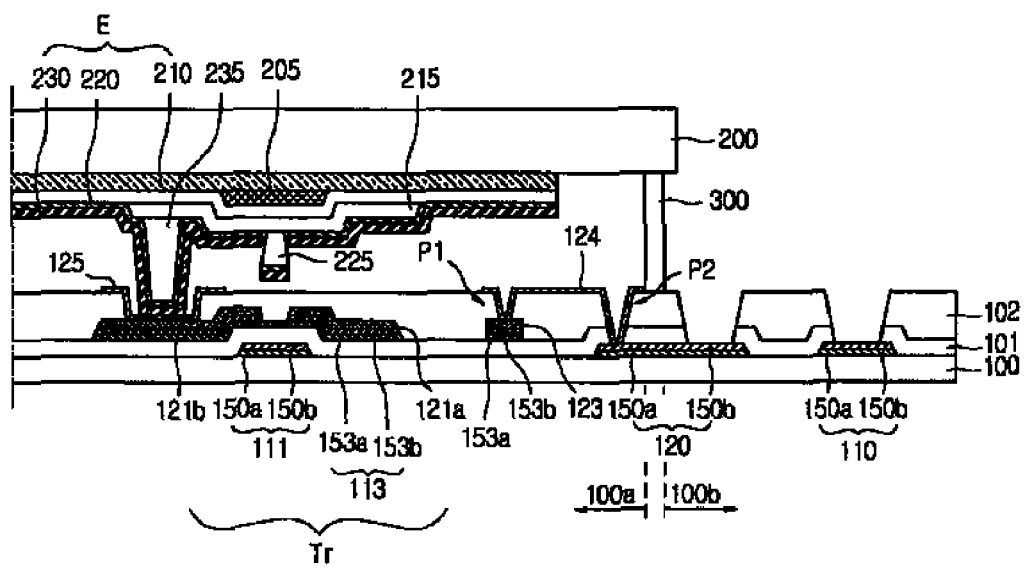
FIG. 3 is a cross-sectional view illustrating a portion of the organic electro-luminescence display device of FIG. 2.

FIG. 3 is a cross-sectional view illustrating a portion of the organic electro-luminescence display device of FIG. 2. FIG. 3 illustrates only one drive TFT but the organic electro-luminescence display device can further include a capacitor and a switching TFT. Also, FIG. 3 illustrates a pad portion provided to the organic electro-luminance display device includes only a data pad and a gate pad, but the pad portion can further include a common voltage pad and a ground pad, which are emitted for convenience in description.

Referring to FIG. 3, the organic electro-luminescence display device includes a first substrate 100 and a second substrate 200. The first and second substrates 100 and 200 are attached to each other using sealant patterns 300. Here, the first substrate 100 is divided into an active region 100a and a peripheral region 100b. The sealant patterns are disposed along an interface between the active region 100a and the peripheral region 100b. Therefore, the active region 100a is sealed from an outside environment using the first and second substrates 100 and 200, and the sealant patterns 300. The peripheral region 100b is exposed to the outside environment.

A plurality of gate lines and data lines are arranged in a matrix in the active region 100a of the first substrate 100. TFTs are formed in pixel regions defined by the gate lines and the data lines. Also, an external circuit portion for applying a signal, e.g., a pad portion for connecting with a TCP and an FPC is formed in the peripheral region 100b of the first substrate 100. Here, the pad portion can include the gate pad 110, the data pad 120, the ground pad (not shown), and the common voltage pad (not shown).

The data pad 120 for receiving a data signal is formed in the active region 100a and the peripheral region 100b. A portion of the data pad 120 that is located in the active region 100a is electrically connected to the data pad link portion 123 formed at an end of the data line. On the other hand, a portion of the data pad 120 that is located in the peripheral region 100b is connected to the external circuit part.

Meanwhile, the second substrate 200 includes the organic light-emitting diode device E having a first electrode 210, an organic light-emitting layer 220, and a second electrode 230. The organic light-emitting diode device E formed on the second substrate 200 faces the first substrate 100.

The first substrate 100 where the TFT Tr and the pad portion are formed will be described in more detail.

The first substrate 100 is defined as the active region 100a and a peripheral region 100b disposed along edges of the active region 100a. A gate line (not shown), a gate electrode 111 ranching from a portion of the gate line, and a power line (not shown) formed in parallel to the gate line are arranged in the active region 100a of the first substrate 100.

A portion of the data pad 120 is disposed in the active region 100a and both sides of the peripheral region of the first substrate 100.

The gate pad 110 is disposed in the peripheral region 100b of the first substrate 100. The gate pad 110 extends from the gate line and is disposed at an end of the gate line.

The gate pad 110 and the data pad 120 include first conductive patterns 150a and conductive patterns 150b. Since the first conductive patterns 150a includes a conductive material having corrosion resistance, the first conductive patterns 150a prevents the gate pad 110 and the data pad 120 are prevented from being corroded by external moisture and oxygen. The first conductive patterns 150a include indium tin oxide (ITO) patterns or indium zinc oxide (IZO) patterns.

The second conductive patterns 150b include a conductive material having resistance lower than that of the first conductive patterns 150a. The second conductive patterns 150b reduces resistance of the first conductive patterns 150a. The second conductive patterns 150b can be formed of Cr or Mo.

In addition, the gate line and the gate electrode 111 can also include the first conductive patterns 150a and the second conductive patterns 150b.

A gate insulating layer 101 is formed over an entire surface of the first substrate 100 to cover the gate electrode 111, the gate pad 110, and the data pad 120.

Active patterns 113 are disposed on a portion of the gate insulating layer 101 that corresponds to the active region 100a. The active patterns 113 include channel patterns 153a formed of amorphous silicon patterns 153a and an ohmic contact layer 153b formed of amorphous silicon patterns doped with impurities. Source/drain electrodes 121a and 121b are formed on the active patterns 113. A data line (not shown) intersecting the gate line is electrically connected to the source electrode 121a. Also, the data pad link portion 123 formed at an end of the data line is disposed on a portion of the gate insulating layer 101 that corresponds to the active region 100a.

The data pad link portion 123 can be formed of the same material as those of the source/drain electrodes 121a and 121b. The channel patterns 153a and the ohmic contact layer 153b can be disposed beneath the data pad link portion 123.

A passivation layer 102 is formed on the first substrate 100 to cover the TFT and the data pad link portion 123.

The passivation layer 102 includes contact holes for exposing the drain electrode 121b, the data pad link portion 123, the gate pad 110, and the data pad 120, respectively.

The contact holes include a first contact hole P1 for exposing a portion of the data pad 120 that corresponds to the active region 110a, and a second contact hole P2 for exposing a portion of the data pad 120 that corresponds to the peripheral region 100b.

The link line 124 is formed on the passivation layer 102 to connect a portion of the data pad 120 that is exposed by the first contact hole P1 to the data pad link portion 123. Examples that can be used for forming the link line 124 include Pt, Au, Ir, Cr, Mg, Ag, Ni, Al, and AlNd. Also, a portion of the data pad that is exposed by the second contact hole P2 contacts an outside circuit part to receive a data signal from the outside circuit part.

In addition, a connection electrode 125 can be disposed on the passivation layer 102. The connection electrode 125 is connected to the drain electrode 121b exposed via the contact hole. The connection electrode 125 prevents the drain electrode 121b from being damaged during a process of forming the contact hole. The connection electrode 125 can include the same conductive material as that of the link line 124.

In addition to what is illustrated in the drawings, the gate pad 110 and the data pad 120 can include the second conductive patterns 150b and the first conductive patterns 150a. The first conductive patterns 150a can include openings formed by etching portions of the second conductive patterns 150b that are exposed by the first and second contact holes P1 and P2.

With this structure, the first conductive patterns 150a constituting the gate pad 110 or the data pad 120 formed of a conductive material having corrosion resistance is exposed to the outside, so that corrosion of the gate pad 110 or the data pad 120 caused by moisture and oxygen from the outside can be prevented.

A ground pad and a common voltage pad now shown in the drawing can be also formed of the same conductive material as that of the gate pad.

Accordingly, a defective pixel of the electro-luminescence display device and reduction in reliability caused by corrosion of the pad portion exposed to the outside can be prevented.

The second substrate 200 where the organic light-emitting diode device E will be described below in detail.

A first electrode 210, which is a common electrode, is disposed on a surface of the second substrate 200 that faces the first substrate 100. In addition, an auxiliary electrode 205 can be further provided between the second substrate 200 and the first electrode 210. The auxiliary electrode 205 further reduces resistance of the first electrode 210. Because the auxiliary electrode 205 is formed of metal having low resistance and is mostly 210. The auxiliary electrode 205 may be formed on a portion on which an image is not displayed.

A buffer layer 215 defining a pixel region is disposed below the first electrode 210. A separator 225 and a spacer 235 spaced a predetermined distance from the separator 225 are disposed under the buffer layer 215.

An organic light-emitting layer 220 and a second electrode 230 are sequentially disposed below the first electrode 210.

The organic light-emitting layer 220 can include a hole injection layer, a hole transport layer, a hole suppression layer, an electron transport layer, and an electron injection layer. The hole injection layer, the hole transport layer, the hole suppression layer, the electron transport layer, and the electron injection layer inject electrons and holes more swiftly to improve a light-emitting efficiency even further.

Also, the second electrode 230 is separated for each pixel region by the separator 225. The separator 225 may have an inversely tapered partition wall shape in order to separate the second electrode 230 for each pixel region. Unlike this, the separator for separating the second electrode 230 for each pixel region can be formed by forming an organic layer on the buffer layer 215, and etching the buffer layer 215 such that an undercut is formed in the buffer layer 215.

Also, because the second electrode 230 covers an upper surface of the spacer 235, a portion of the second electrode 230 is electrically connected to the TFT of the first substrate 100 using the spacer 235.

In addition, a moisture absorbing layer can be further disposed below the second electrode 230. The moisture absorbing layer is designed for preventing the organic light-emitting layer 220 from be damaged by moisture and/or oxygen.

With the above process, a TFT is formed on an inner side of the first substrate 100, and an organic light-emitting diode device is formed on an inner side of the second substrate 200. The TFT and the organic light-emitting diode device E are electrically connected to each other by the second electrode 230 formed on the spacer 235. Therefore, as the TFT is driven, the organic light-emitting diode device E emits light. The light is delivered to the second substrate 200 to provide an image to a user.

Second Embodiment

FIGS. 4A to 4F are cross-sectional views explaining a method for manufacturing an organic electro-luminescence display device according to a second embodiment of the present invention.

Figure 4A:
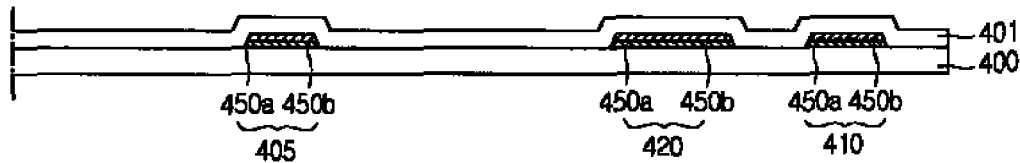
FIGS. 4A to 4F are cross-sectional views explaining a method for manufacturing an organic electro-luminescence display device according to a second embodiment of the present invention.

Referring to FIG. 4A, a first conductive layer and a second conductive layer are sequentially formed on a first substrate 400, which is a glass substrate or a plastic substrate. The first and second conducive layers are patterned to simultaneously form a gate line (not shown) including first conductive patterns 450a and second conductive patterns 450b having a line shape, a gate electrode 405 branching from the gate line, and a gate pad 410 located at an end of the gate line. Also, a data pad 420 separated a predetermined distance from the gate line is simultaneously formed on the first substrate 100.

Here, the first conductive patterns 450a is formed of a conductive material having corrosion resistance and can include an ITO or an IZO. Also, the second conductive patterns 450b do not chemically react with the first conductive patterns 450a, and can be formed of a conductive material of a low resistor having smaller resistance than that of the first conductive patterns 450a by depositing Cr or Mo.

After that, a gate insulating layer 401 is formed over an entire surface of the first substrate 400 including the gate electrode 405, the gate pad 410, and the data pad 420. The gate insulating layer 401 can be a silicon oxide layer, a silicon nitride layer formed using chemical vapor deposition (CVD), or a stacked layer of these layers.

Figure 4B:
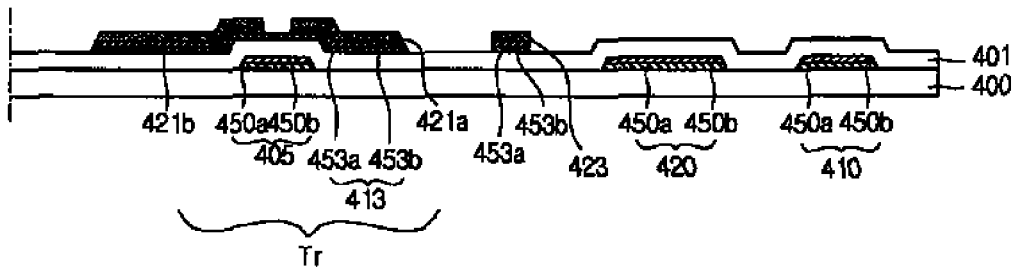

Referring to FIG. 4B, an amorphous silicon layer, an amorphous silicon layer, and a conductive layer doped with p-type or n-type impurities located on the gate insulating layer 401 are patterned to form active patterns 413 in which channel patterns 453*a* and an ohmic contact layer 453*b* are stacked that are located to correspond to the gate electrode 405. Simultaneously, a data line (not shown) intersecting the gate line, a data pad link portion 423 located at an end of the data line, and source/drain electrodes 421*a* and 421*b* are formed.

Here, since the active patterns 413 and the source/drain electrodes 421*a* and 421*b* disposed on the active patterns 413 are simultaneously formed using one mask, the channel patterns 453*a* and the ohmic contact layer 453*b* can be further disposed under the data line and the pad link portion 423.

With the above process, a TFT including the gate electrode 405, the active patterns 413, and the source/drain electrodes 421*a* and 421*b*; a gate pad 410 including the first conductive patterns 450*a* having corrosion resistance and the second conductive patterns 450*b* for reducing resistance of the first conductive patterns 450*a*; and the data pad 420 are formed on the first substrate 400.

Figure 4C:
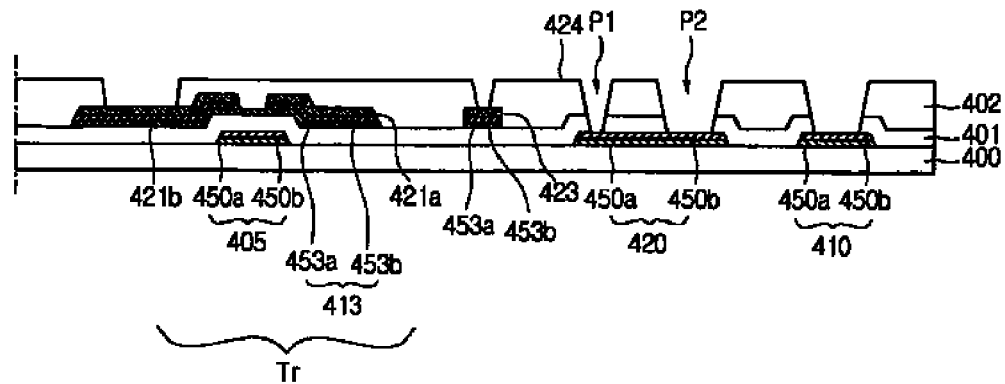

Referring to FIG. 4C, a passivation layer 402 is formed on the gate insulating layer 401 including the TFT, the gate pad 410, and the data pad 420. The passivation layer 402 can be an organic layer or an inorganic layer. For example, the organic layer can be one selected from the group consisting of an acryl-based resin, benzo-cyclo-butene (BCB), polyimide (PI), and a novolak-based resin. Also, the inorganic layer can be a silicon oxide layer, a silicon nitride layer, or a stacked layer of these layers.

Contact holes exposing the drain electrode 421*b*, the data pad link portion 423, the gate pad 410, and the data pad 420, respectively, are formed in the passivation layer 402.

The contact holes can include a first contact hole P1 and a second contact hole P2 exposing both ends of the data pad 420, respectively.

Figure 4D:
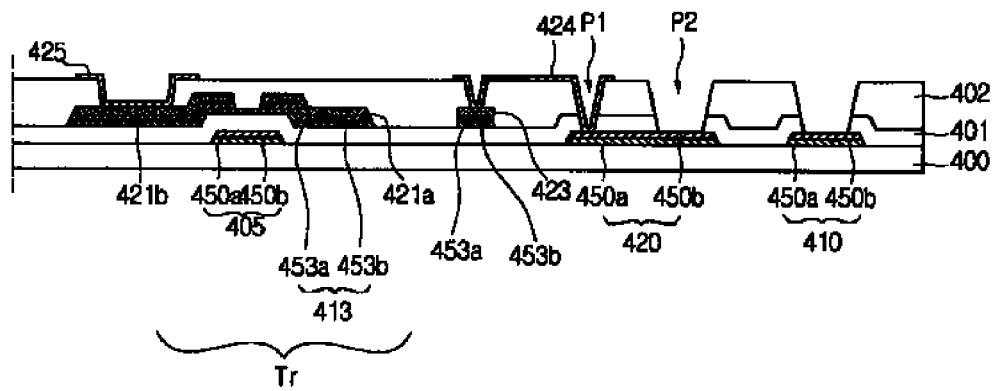

Referring to FIG. 4D, a conductive layer deposited on the passivation layer 402 including the contact holes is patterned to form a link line 424 for electrically connecting the data pad link portion 423 to the data pad 420. Accordingly, a data signal applied via the data pad 420 is delivered to the data pad link portion 423 via the link line 424 and applied to the TFT via the data line.

With the above process, the gate pad 410 including the first conductive patterns 450*a* and exposed to the outside, and the data pad 420 can be simultaneously formed.

Simultaneously, a connection electrode 425 electrically connected to the drain electrode 421*b* exposed via the contact hole can be further formed. The connection electrode 425 is designed for preventing the drain electrode 421*b* from being damaged during a process of forming the contact hole.

Figure 4E:
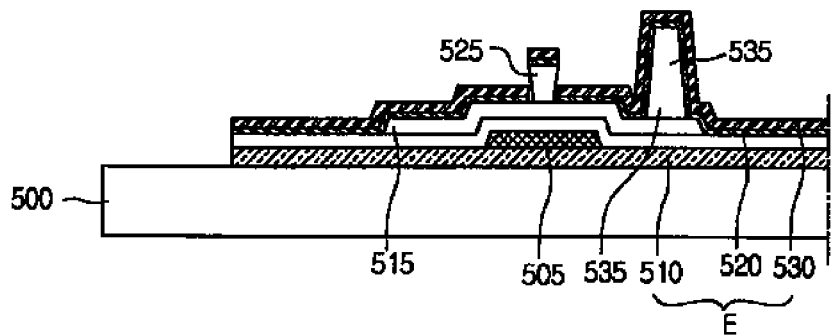

Meanwhile, referring to FIG. 4E, a second substrate 500 on which organic light-emitting diode devices E are formed is provided.

A process for forming the organic light-emitting diode devices E on the second substrate 500 will be described below in detail.

A first electrode 510 is formed as a common electrode on the second substrate 500.

The first electrode is formed of a conductive material having transparency and a high work function such as an ITO and an IZO.

A buffer layer 515 for defining each pixel region is formed on the first electrode 510. The buffer layer 515 can be an insulating layer. A separator 525 is formed on the buffer layer 515. Here, the separator 525 can be formed in an inversely tapered partition wall shape. The separator 525 can be formed of an organic insulator. Also, a spacer 535 spaced a predetermined distance from the separator 525 is formed on the buffer 515.

An organic light-emitting layer 520 and a second electrode 530 are sequentially formed over an entire surface of the first electrode 510 including the spacer 535. The second electrode 530 is selectively formed in the pixel region by the separator 525. Also, because the second electrode 530 covers an upper portion of the spacer 535, a portion of the second electrode 530 that corresponds to the spacer 535 protrudes toward the first substrate 100.

A hole injection layer and/or a hole transport layer can be further formed before the organic light-emitting layer 520 is formed. Also, at least one of a hole suppression layer, an electron transport layer, and an electron injection layer can be further formed after the organic light-emitting layer 520 is formed.

Here, a moisture absorbing layer (not shown) can be further formed on the second electrode 530. The moisture absorbing layer can include BaO or CaO. Accordingly, since the moisture absorbing layer can protect the organic light-emitting diode device E from moisture and oxygen that have penetrated into a device, reduction in growth of a completed apparatus can be prevented.

Figure 4F:
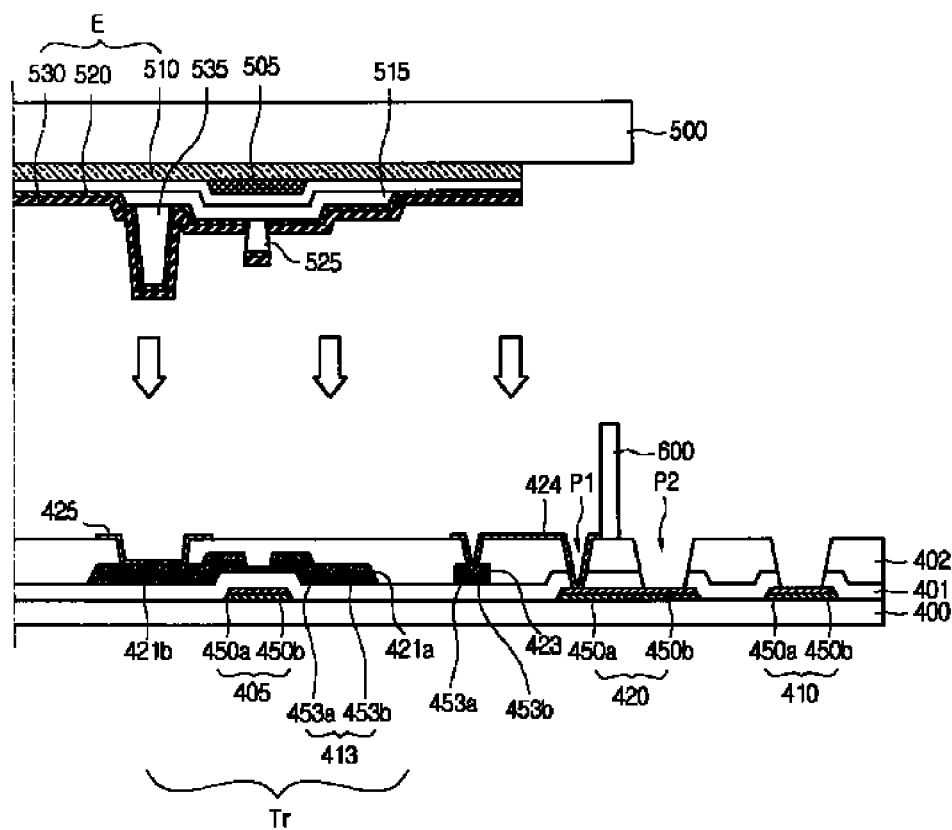

Referring to FIG. 4F, after sealant patterns 600 are formed on the first substrate 400 including the TFT or the second substrate 500 including the organic light-emitting diode device E, an encapsulating process for attaching the two substrates to each other is performed, so that an organic electro-luminescence display device is manufactured. The sealant patterns 600 are formed to cross a portion between the first contact hole P1 and the second contact hole P2 exposing both ends of the data pad 420, respectively. Also, the sealant patterns 600 are formed such that the data pad link portion 424 is located inside the sealant patterns 600. Accordingly, the data pad link portion 424 is not exposed to the outside.

The drain electrode 421*b* of the first substrate 400 contacts a portion of the second electrode 530 that is protruded by the spacer 535 of the second substrate 500.

Furthermore, interior spaces formed by the first and second substrates 400 and 500 can be filled with an inert gas such as a nitrogen gas in order to remove moisture and oxygen. By doing so, it is possible to prevent growth of the organic light-emitting layer 520 formed on the second substrate 500 from being reduced or a black spot from being generated due to moisture and oxygen.

Third Embodiment

FIGS. 5A to 5D are cross-sectional views explaining a method for manufacturing an organic electro-luminescence display device according to a third embodiment of the present invention. Here, since the method for manufacturing the organic electro-luminescence display device according to the third embodiment of the present invention is the same as the method for manufacturing the organic electro-luminescence display device according to the second embodiment of the present invention except that a data pad is formed by changing a deposition order of the first conductive patterns and the second conductive patterns, description of the same parts will be omitted. The same reference numeral denotes the same element.

Figure 5A:
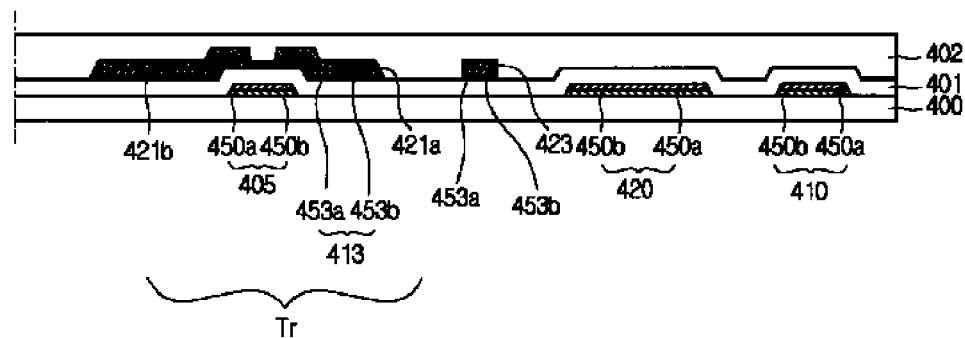
FIGS. 5A to 5D are cross-sectional views explaining a method for manufacturing an organic electro-luminescence display device according to a third embodiment of the present invention.

Referring to FIG. 5A, a second conductive layer and a first conductive layer are sequentially stacked on a first substrate 400. The stacked first and second conductive layers are patterned to form a gate line (not shown) including first conductive patterns 450a and second conductive patterns 450b having a line shape, a gate electrode 405 branching from the gate line, and a gate pad 410 located at an end of the gate line. Also, a data pad 420 is simultaneously formed on the first substrate 100.

Here, the first conductive patterns 450a is formed of a conductive material having corrosion resistance and can include an ITO layer or an IZO layer. Also, the second conductive patterns 450b do not chemically react with the first conductive patterns 450a, and can be formed of Cr or Mo, which is a conductive material of a low resistor having smaller resistance than that of the first conductive patterns 450a.

After that, a gate insulating layer 401 is formed on an entire surface of the first substrate 400 including the gate electrode 405, the gate pad 410, and the data pad 420.

After active patterns 413 in which channel patterns 453a and an ohmic contact layer 453b are stacked, source/drain electrodes 421a and 421b, a data line (not shown), and a data pad link portion 423 located at an end of the data line are formed on the gate insulating layer 401, a passivation layer 402 is formed.

Figure 5B:
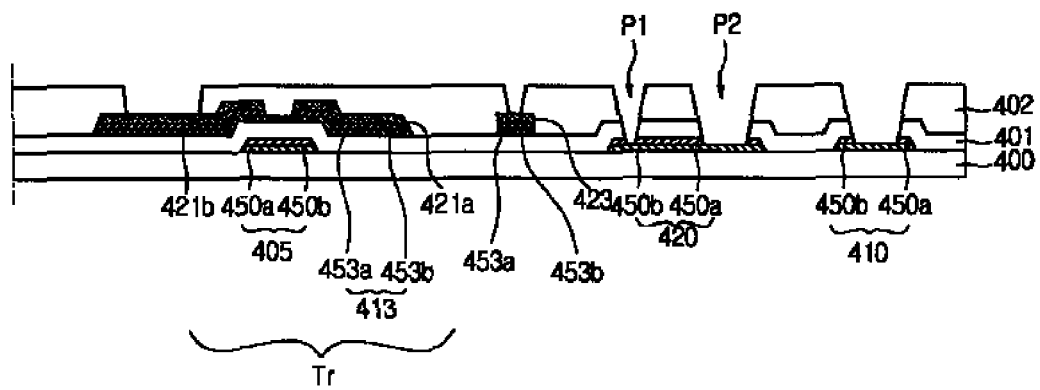

Referring to FIG. 5B, contact holes exposing the drain electrode 421b, the data pad link portion 423, the gate pad 410, and the data pad 420, respectively, are formed in the passivation layer 402. The contact holes can include a first contact hole P1 and a second contact hole P2 exposing both ends of the data pad 420, respectively.

Portions of the gate pad 410 and the data pad 420 exposed via the contact holes formed in the passivation layer 402, and a portion of the second conductive patterns 450b, which is an upper layer of the data pad link portion 423 are etched to form an opening exposing the first conductive patterns 450a. That is, the first conductive patterns 450a having corrosion resistance are exposed to the outside to contact an external circuit.

Figure 5C:
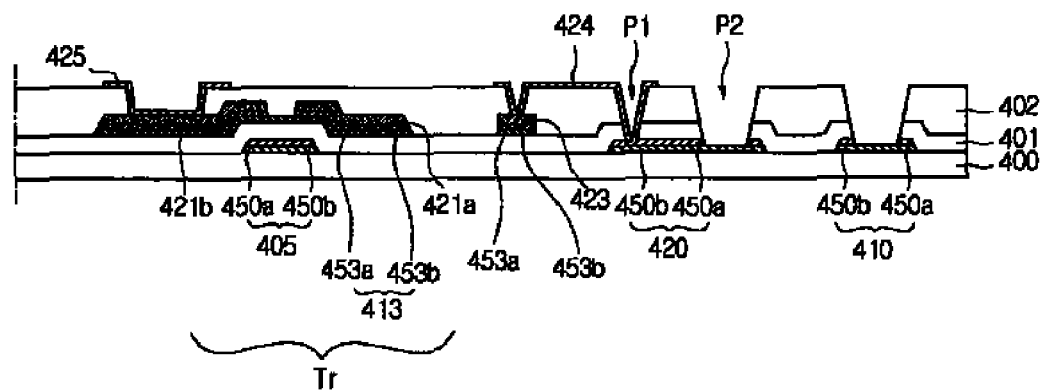

Referring to FIG. 5C, a conductive material is deposited on the passivation layer 402 including the contact holes. The deposited conductive material is patterned to form a link line 424 for electrically connecting the data pad link portion 423 to the data pad 420. Also, because the drain electrode 421b can be lost during the process for forming the contact holes, a connection electrode 425 for compensating for this loss can be further formed.

Figure 5D:
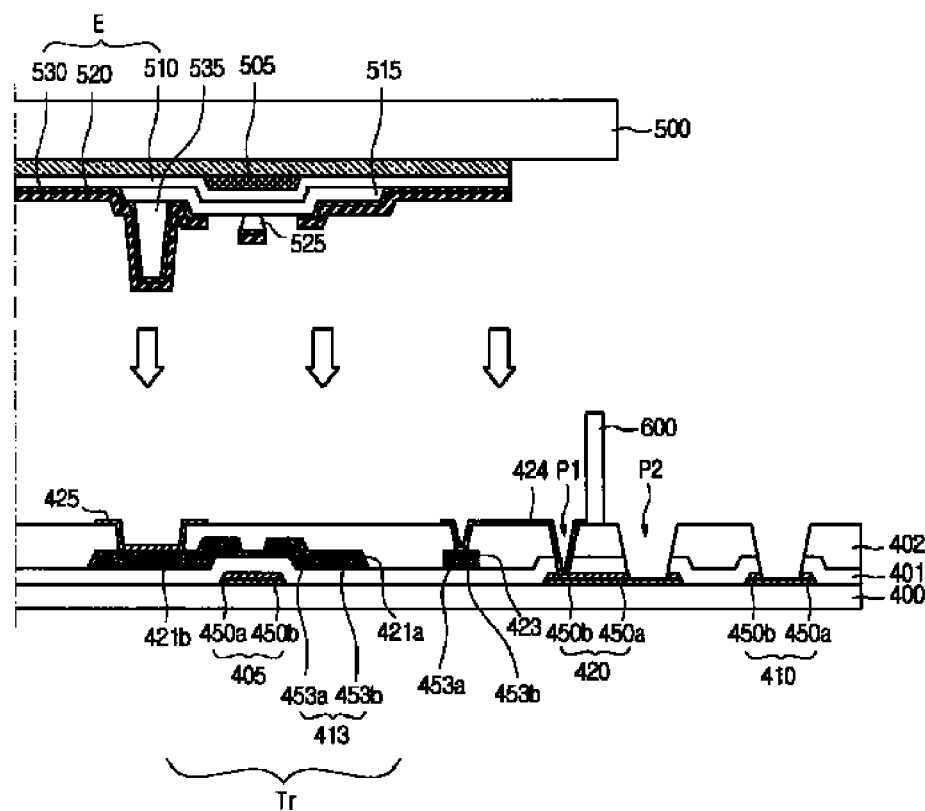

Referring to FIG. 5D, after sealant patterns 600 are formed on the first substrate 400 including the TFT or the second substrate 500 including the organic light-emitting diode device E, an encapsulating process for attaching the two substrates to each other is performed, so that an organic electro-luminescence display device is manufactured.

Fourth Embodiment

Figure 6:
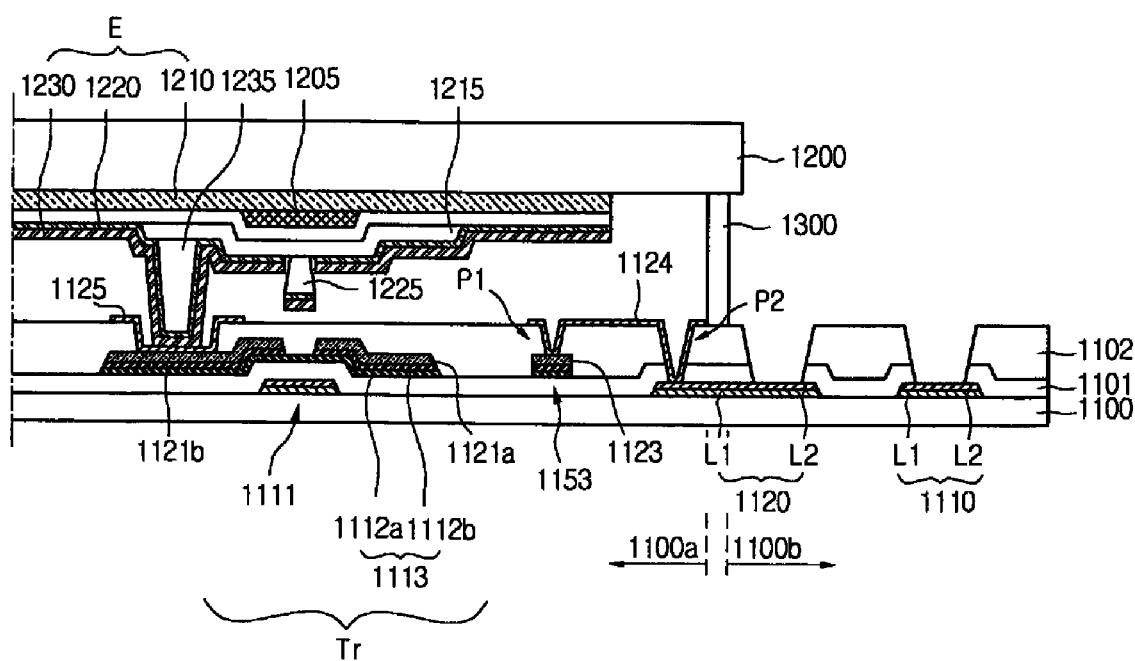
FIG. 6 is a cross-sectional view illustrating another portion of the organic electro-luminescence display device of FIG. 2.

FIG. 6 is a cross-sectional view illustrating another portion of the organic electro-luminescence display device of FIG. 2. FIG. 3 illustrates only one driving TFT, but a capacitor and a switching TFT can be further formed. Also, a pad provided to the organic electro-luminescence display device is illustrated to be limited to a data pad and a gate pad, but a common voltage pad and a ground pad can be further formed. The common voltage pad and the ground pad have been omitted for convenience in description.

Referring to FIG. 6, a first substrate 1100 and a second substrate 1200 of the organic electro-luminescence display device are attached to each other using sealant patterns 1300. Here, the first substrate 1100 includes an active region 1100a and a peripheral region 1100b disposed around the active region 1100a. The sealant patterns 1300 are provided to an interface between the active region 1100a and the peripheral region 1100b. Therefore, the active region 1100a is sealed from an external environment, and the peripheral region 1100b is exposed to the external environment.

A plurality of gate lines and data lines intersect in the active region 1100a of the first substrate 1100. TFTs are formed in pixel regions defined by the gate lines and the data lines. Also, an external circuit portion for applying a signal, e.g., a pad portion for connecting with a TCP and an FPC is formed in the peripheral region 1100b of the first substrate 1100. Here, the pad portion can include the gate pad 1110, the data pad 1120, the ground pad (not shown), and the common voltage pad (not shown).

The gate pad 1110 for receiving a selection signal extends over the active region 1100a and the peripheral region 1100b. A portion of the gate pad 1110 that is located in the active region 1100a is connected to the gate pad link portion 1153 formed at an end of the gate line. A portion of the gate pad 1110 that is located in the peripheral region 1100b is connected to the external circuit portion.

Meanwhile, organic light-emitting diode devices E having a first electrode 1210, an organic light-emitting layer 1220, and a second electrode 1230 are formed under the second substrate 1200.

The first substrate 1100 on which the TFTs and the pad portion are formed will be described below in detail.

The first substrate 1100 includes the active region 1100a and the peripheral region 1100b. The active region 1100a includes the gate line (not shown), a gate electrode 1111 branding from a portion of the gate line, and the gate pad link portion 1153 formed at an end of the gate line.

Also, a power line (not shown) spaced a predetermined distance from and formed in parallel to the gate line is further formed in the active region 1100a.

A gate insulating layer 1101 is formed over an entire surface of the first substrate 1100 including the gate electrode 1111, the gate line, and the gate pad link portion 1153.

Active patterns 1113 are disposed on a portion of the gate insulating layer 1101 that corresponds to the gate electrode 1111. The active patterns 1112 can be formed by sequentially stacking channel patterns 1112a formed of an amorphous silicon layer, and an ohmic contact layer 1112b formed of an amorphous silicon layer doped with impurities.

Source/drain electrodes 1121a and 1121b are formed on the active patterns 1113. A data line (not shown) intersecting the gate line is located on the source electrode 1121a. A gate pad 1110 extends on a portion of the gate insulating layer 1101 that corresponds to the active region 1100a and the peripheral region 1100b. Also, a data pad portion 1120 formed at an end of the data line is disposed on a portion of the gate insulating layer 1101 that corresponds to the peripheral region 1100a.

Here, the gate pad 1110 and the data pad 1120 have a double-layered structure in which first conductive patterns L1 and second conductive patterns L2 are sequentially stacked.

The first conductive patterns L1 are formed of a conductive material having corrosion resistance. Accordingly, even when the gate pad 1110 and the data pad 1120 are exposed to the outside, corrosion caused by external moisture and oxygen is prevented from being generated because the first conductive patterns L1 are formed of the conductive material having the corrosion resistance. The first conductive patterns L1 can be formed of an ITO or an IZO.

The second conductive patterns L2 can be formed of a conductive material of a low resistor having smaller resistance than that of the first conductive patterns L1. The second conductive patterns L2 reduce resistance of the first conductive patterns L1. The second conductive patterns L2 can be formed of Cr or Mo with consideration of reactivity with the first conductive patterns L1.

Furthermore, the data line and the source/drain electrodes 1121a and 1121b can be formed by sequentially stacking the first conductive patterns L1 and the second conductive patterns L2.

The gate electrode 1111, the active layer 1112, the TFT including the source/drain electrodes 1121a and 1121b, and the gate pad link portion 1153 are formed in the active region 1100a of the first substrate 1100. The gate pad 1110 extends to the active region 1100a and the peripheral region 1110b. Also, the data pad 1120 is formed on the peripheral region 1100b.

A passivation layer 1102 is formed over an entire surface of the first substrate 1100 including the TFT, the gate pad link portion 1153, the gate pad 1110, and the data pad 1120.

The passivation layer 1102 includes contact holes exposing the drain electrode 1122b, the gate pad link portion 1153, the gate pad 1110, and the data pad 1120, respectively. The contact holes can include a first contact hole P1 exposing a portion corresponding to the active region 1100a and a second contact hole P2 exposing a portion corresponding to the peripheral region 1100b.

A link line 1124 is located on the passivation layer 1102 to connect a portion of the gate pad 110 that is exposed by the first contact hole P1 to the gate pad link portion 1153. The link line 1124 can be formed of one material selected from the group consisting of Pt, Au, Ir, Cr, Mg, Ag, Ni, Al, and AlNd. Also, a portion of the gate pad 1110 that is exposed via the second contact hole P2 contacts an external circuit part.

Further, a connection electrode 1125 connected to a portion of the drain electrode 1121b that is exposed via the contact hole can be further formed on the passivation layer 1102. The connection electrode 1125 is formed for compensating for loss of the drain electrode 1121b during a process of forming the contact holes.

Here, the connection electrode 1125 can be formed of the same conductive material as that of the link line 1124 for convenience in a process.

Unlike the drawing, the gate pad 1110 and the data pad 1120 can be formed in a double layer in which the second conductive patterns L2 and the first conductive patterns L1 are sequentially stacked. The first conductive patterns L1 is exposed to the outside by forming an opening in a portion of the second conductive patterns L2 that is located in a portion exposed via the first and second contact holes P1 and P2. That is, the second conductive patterns L2 constituting the gate pad 1110 and the data pad 1120 are etched to expose the first conductive patterns L1.

Accordingly, a portion of the gate pad 1110 or the data pad 1120 that is exposed to the outside is not easily corroded by external moisture and oxygen because the first conductive patterns L1 formed of a conductive material having corrosion resistance is exposed to the outside.

In other words, since the first conductive patterns are exposed to the outside in the pad portion exposed to the outside, a defective pixel of the electro-luminescence display device and reduction in reliability caused by corrosion of the pad portion can be prevented.

Meanwhile, the second substrate 1200 on which organic light-emitting diode devices E are formed will be described below in detail.

A first electrode 1210 is located as a common electrode under the second substrate 1200. Here, an auxiliary electrode 1205 can be further provided between the second substrate 1200 and the first electrode 1210. The auxiliary electrode 1205 further reduces resistance of the first electrode 1210. Because the auxiliary electrode 1205 is formed of metal having low resistance and is mostly opaque, the auxiliary electrode 1205 may be formed on a portion on which an image is not displayed.

A buffer layer 1215 defining a pixel region is disposed below the first electrode 1210. A separator 1225 and a spacer 1235 spaced a predetermined distance from the separator 1225 are disposed under the buffer layer 1215.

An organic light-emitting layer 1220 and a second electrode 1230 are sequentially disposed below the first electrode 1210.

The organic light-emitting layer 1220 can include a hole injection layer, a hole transport layer, a hole suppression layer, an electron transport layer, and an electron injection layer on or lower the organic light-emitting layer 1220. Since an energy level can be properly adjusted at boundaries between the first electrode 1210, the organic light-emitting layer 1220, and the second electrode 1230, electrons and holes are more swiftly injected to the organic light-emitting layer 1220 to improve a light-emitting efficiency even further.

Also, the second electrode 1230 is separated for each pixel region by the separator 1225. The separator 1225 may have an inversely tapered partition wall shape in order to separate the second electrode 1230 for each pixel region. Unlike this, the separator 1225 for separating the second electrode 1230 for each pixel region can be formed by forming an organic layer on the buffer layer 1215, and etching the buffer layer 1215 such that an undercut is formed in the buffer layer 1215.

The second electrode 1230 is formed also on the spacer 1235. A portion of the second electrode 1230 protrudes downward by the spacer 1235 to connect with the TFT of the first substrate 1100.

Further, though not shown in the drawing, a moisture absorbing layer located under second electrode 1230 can be further formed. The moisture absorbing layer is intended for preventing the organic light-emitting layer 1220 from being damaged.

With the above process, a TFT is formed on an inner side of the first substrate 1100, and an organic light-emitting diode device is formed on an inner side of the second substrate 1200. The TFT and the organic light-emitting diode device E are electrically connected to each other by the second electrode 1230 formed on the spacer 1235. Therefore, as the TFT is driven, the organic light-emitting diode device E emits light. The light is delivered to the second substrate 1200 to provide an image to a user.

FIGS. 7A to 7G are cross-sectional views explaining a method for manufacturing an organic electro-luminescence display device according to the fourth embodiment of the present invention.

Figure 7A:
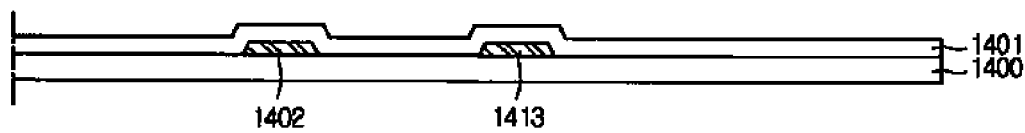
FIGS. 7A to 7G are cross-sectional views explaining a method for manufacturing an organic electro-luminescence display device according to a fourth embodiment of the present invention.

Referring to FIG. 7A, a first substrate 1400 is provided. The first substrate 1400 can be a glass substrate or a plastic substrate.

A conductive layer is formed on the first substrate 1400. The conductive layer is patterned to form a gate line (not shown) having one direction, a gate electrode 1402 branching from the gate line, and a gate pad link portion 1413 located at an end of the gate line.

Also, though not shown in the drawing, a power line space a constant interval from and disposed in parallel to the gate line, and a ground pad link portion located at an end of the power line can be further formed.

After that, a gate insulating layer 1401 is formed on an entire surface of the first substrate 1400 including the gate electrode 1402 and the gate pad link portion 1413. The gate insulating layer 1401 can be a silicon oxide layer, a silicon nitride layer formed using chemical vapor deposition (CVD), or a stacked layer of these layers.

Figure 7B:
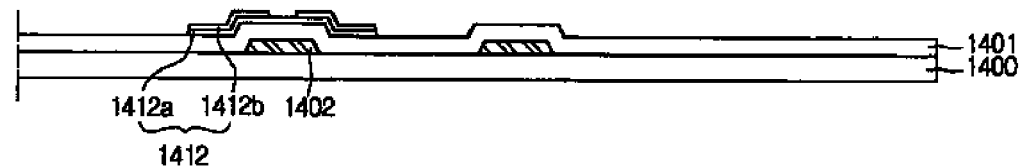

Referring to FIG. 7B, an amorphous silicon layer, and an amorphous silicon layer and a conductive layer doped with p-type or n-type impurities located on the gate insulating layer 1401 are sequentially deposited and patterned to form active patterns 1412 in which channel patterns 1412a and an ohmic contact layer 1412b are stacked that are located to correspond to the gate electrode 1402.

Figure 7C:
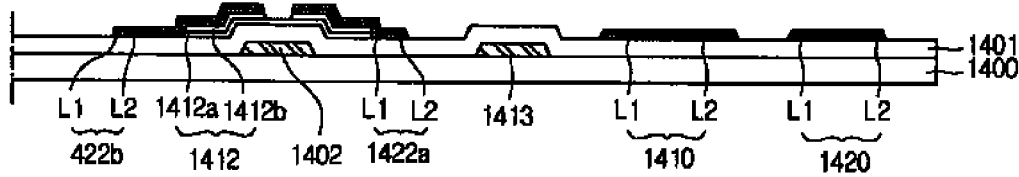

Referring to FIG. 7C, first conductive patterns L1 and second conductive patterns L2 are sequentially formed on the gate insulating layer 1401 including the active layer 1412 and patterned to form a data line (not shown) intersecting the gate line, a data pad 1420 located at an end of the data line, source/drain electrodes 1421a and 1421b. Simultaneously, a gate pad 1410 separated from the data line is formed.

Also, though not shown in the drawing, an island-shaped ground pad and a common voltage pad can be further formed.

Here, the first conductive patterns L1 are formed of a conductive material having corrosion resistance by depositing an ITO or an IZO. Also, the second conductive patterns L2 do not chemically react with the first conductive patterns L1, and can be formed of Cr or Mo, which is a conductive material of a low resistor having smaller resistance than that of the first conductive patterns L1.

With the above process, a TFT including the gate electrode 1402, the active patterns 1412, and the source/drain electrodes 1422a and 1422b; a gate pad 1410 including the first conductive patterns L1 having corrosion resistance and the second conductive patterns L2 for reducing resistance of the first conductive patterns L2; and the data pad 1420 are formed on the first substrate 1400.

Figure 7D:
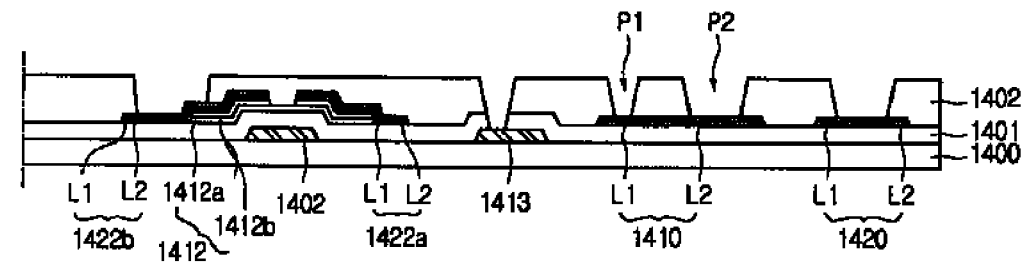

Referring to FIG. 7D, a passivation layer 1402 is formed on the gate insulating layer 1401 including the TFT, the gate pad 1410, and the data pad 1420. The passivation layer 1402 can be an organic layer or an inorganic layer. For example, the organic layer can be one selected from the group consisting of an acryl-based resin, benzo-cyclo-butene (BCB), polyimide (PI), and a novolak-based resin. Also, the inorganic layer can be a silicon oxide layer, a silicon nitride layer, or a stacked layer of these layers.

Contact holes exposing the drain electrode 1422b, the gate pad link portion 1413, the gate pad 1410, and the data pad 1420, respectively, are formed in the passivation layer 1402.

The contact holes can include a first contact hole P1 and a second contact hole P2 exposing both ends of the gate pad 1410, respectively.

Figure 7E:
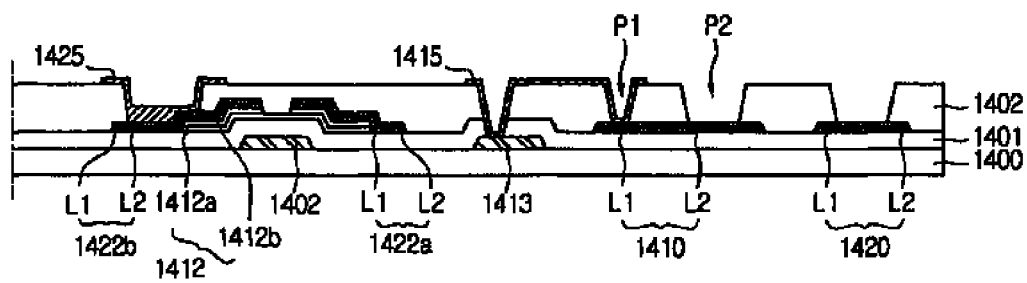

Referring to FIG. 7E, a conductive material is deposited on the passivation layer 1402 including the contact holes, and patterned to form a link line 1415 for electrically connecting the gate pad link portion 1413 to the gate pad 1410. Accordingly, a selection signal applied via the gate pad 1410 is delivered to the gate line via the link line 1415 and the gate pad link portion 1413, and finally applied to the TFT to turn on the gate electrode 1402.

With the above process, the gate pad 1410 including the first conductive patterns L1 and exposed to the outside, and the data pad 1420 can be simultaneously formed.

Simultaneously, a connection electrode 1425 electrically connected to the drain electrode 1422b exposed via the contact hole can be further formed. The connection electrode 1425 is designed for compensating for the drain electrode 1422b from being lost during a process of forming the contact hole.

Figure 7F:
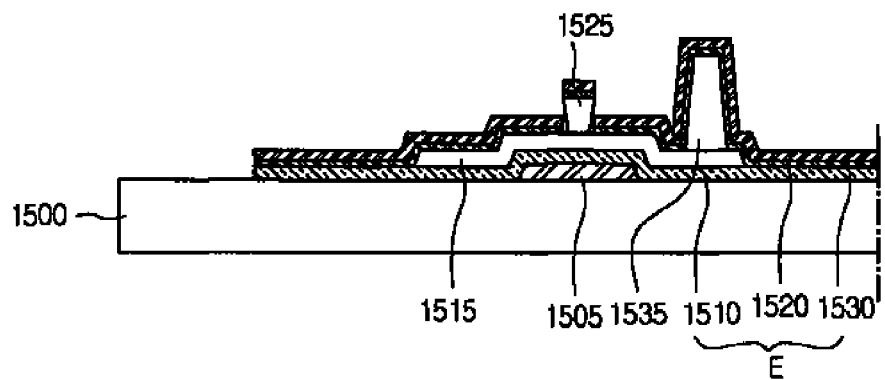

Meanwhile, referring to FIG. 7F, a second substrate 1500 on which organic light-emitting diode devices E are formed is provided.

A process for forming the organic light-emitting diode devices E on the second substrate 1500 will be described below in detail. On the first place, the second substrate 1500 is provided. A first electrode 1510 is formed as a common electrode on the second substrate 1500.

The first electrode 1510 is formed of a conductive material having transparency and a high work function such as an ITO and an IZO.

A buffer layer 1515 for defining each pixel region is formed on the first electrode 1510. The buffer layer 1515 can be an insulating layer. A separator 1525 is formed on the buffer layer 1515. Here, the separator 1525 can be formed in an inversely tapered partition wall shape. The separator 1525 can be formed of an organic insulator. Also, a spacer 1535 spaced a predetermined distance from the separator 1525 is formed on the buffer 1515.

An organic light-emitting layer 1520 and a second electrode 1530 are sequentially formed over an entire surface of the first electrode 1510 including the spacer 1535. The second electrode 1530 is automatically separated into subpixels by the separator 1525. Also, because the second electrode 1530 covers an upper portion of the spacer 1535, a portion of the second electrode 1530 that corresponds to the spacer 1535 protrudes upward.

A hole injection layer and/or a hole transport layer can be further formed before the organic light-emitting layer 1520 is formed. Also, at least one of a hole suppression layer, an electron transport layer, and an electron injection layer can be further formed after the organic light-emitting layer 1520 is formed.

Here, a moisture absorbing layer (not shown) can be further formed on the second electrode 1530. The moisture absorbing layer can include BaO or CaO. Accordingly, since the moisture absorbing layer can protect the organic light-emitting diode device E from moisture and oxygen that have penetrated into a device, reduction in growth of a completed apparatus can be prevented.

Figure 7G:
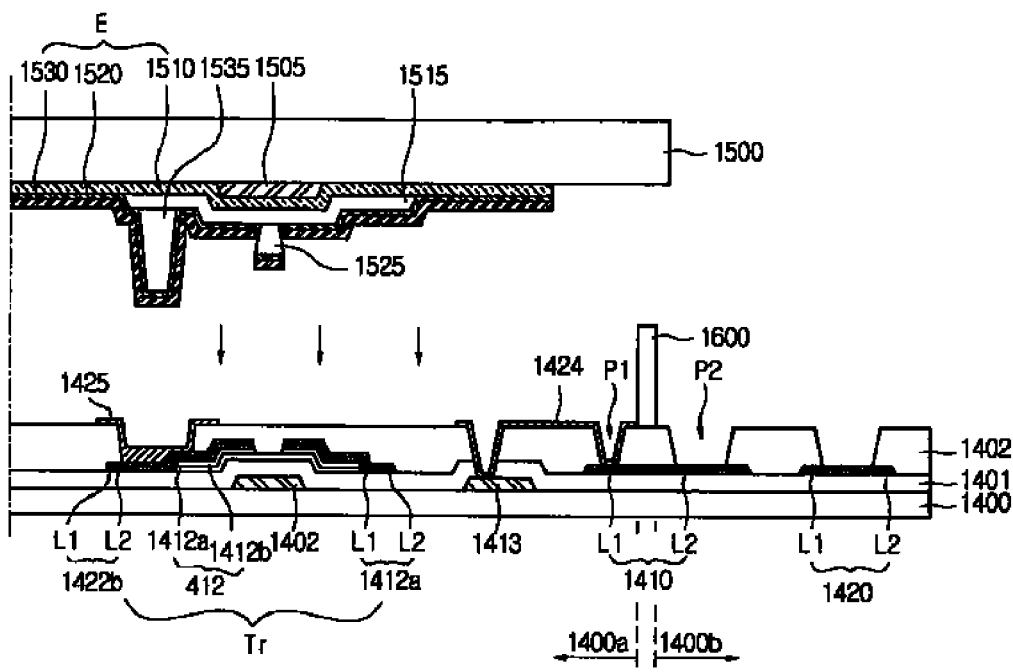

Referring to FIG. 7G, after sealant patterns 1600 are formed on the first substrate 1400 including the TFT or the second substrate 1500 including the organic light-emitting diode device E, an encapsulating process for attaching the two substrates to each other is performed, so that an organic electro-luminescence display device is manufactured. The sealant patterns 1600 are formed to cross a portion between the first contact hole P1 and the second contact hole P2 exposing both ends of the gate pad 1410, respectively. Also, the sealant patterns 1600 are formed such that the gate pad link portion 1413 is located inside the sealant patterns 1600. Accordingly, the gate pad link portion 1413 is not exposed to the outside.

The drain electrode 1422b of the first substrate 1400 contacts a portion of the second electrode 1530 that is protruded by the spacer 1535 of the second substrate 1500.

Furthermore, interior regions formed by the first and second substrates 1400 and 1500 can be filled with an inert gas in order to remove moisture and oxygen. By doing so, it is possible to prevent growth of the organic light-emitting layer 1420 formed on the second substrate 1500 from being reduced or a black spot from being generated due to moisture and oxygen.

FIGS. 8A to 8D are cross-sectional views explaining a method for manufacturing an organic electro-luminescence display device according to a fifth embodiment of the present invention. Here, since the method for manufacturing the organic electro-luminescence display device according to the fifth embodiment of the present invention is the same as the method for manufacturing the organic electro-luminescence display device according to the second embodiment of the present invention except that a gate pad is formed by changing a deposition order of the first conductive patterns and the second conductive patterns, description of the same parts will be omitted. The same reference numeral denotes the same element.

Figure 8A:
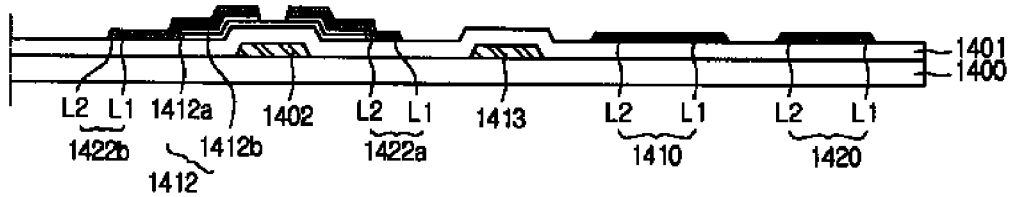
FIGS. 8A to 8D are cross-sectional views explaining a method for manufacturing an organic electro-luminescence display device according to a fifth embodiment of the present invention.

Referring to FIG. 8A, a conductive layer is formed on the first substrate 1400. The conductive layer is patterned to form a gate line (not shown) having one direction, a gate electrode 1402 branching from the gate line, and a gate pad link portion 1413 located at an end of the gate line.

A gate insulating layer 1401 is formed on an entire surface of the first substrate 1400 including the gate electrode 1402 and the gate pad link portion 1413.

An active layer 1412 in which a channel layer 1412a and an ohmic contact layer 1412b are stacked is formed on the gate insulating layer 1401.

After that, second conductive patterns L2 and first conductive patterns L1 are sequentially stacked on the gate insulating layer 1401 including the active layer 1412, and patterned to form source/drain electrodes 1422a and 1422b, a data line (not shown), a data pad 1420 located at an end of the data line, and an island-shaped gate pad 1410.

Here, the first conductive patterns L1 are formed of a conductive material having corrosion resistance by depositing an ITO or an IZO. Also, the second conductive patterns L2 do not chemically react with the first conductive patterns L1, and can be formed of Cr or Mo, which is a conductive material of a low resistor having smaller resistance than that of the first conductive patterns L1.

Figure 8B:
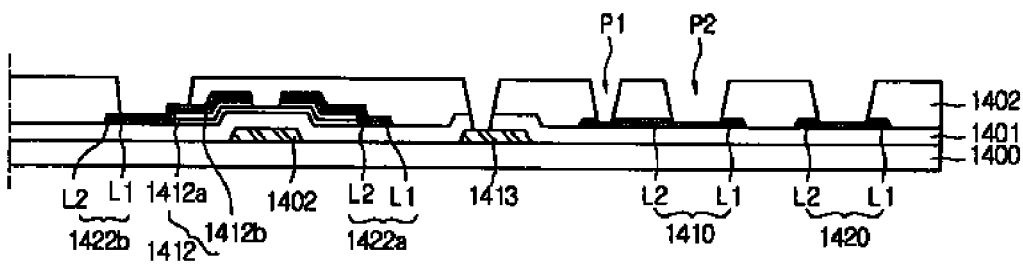

Referring to FIG. 8B, a passivation layer 1402 is formed on the gate insulating layer 1401 including the source/drain electrodes 1422a and 1422b, the gate pad 1410, and the data pad 1420.

Contact holes exposing the drain electrode 1422b, the gate pad link portion 1413, the gate pad 1410, and the data pad 1420, respectively, are formed in the passivation layer 1402. The contact holes can include a first contact hole P1 and a second contact hole P2 exposing both ends of the gate pad 1410, respectively.

Portions of the gate pad 1410 and the data pad 1420 exposed via the contact holes formed in the passivation layer 1402, and a portion of the second conductive patterns L2, which is an upper layer of the gate pad link portion 1413 are etched to form an opening exposing the first conductive patterns L1. That is, the first conductive patterns L1 having corrosion resistance are exposed to the outside to contact an external circuit.

Figure 8C:
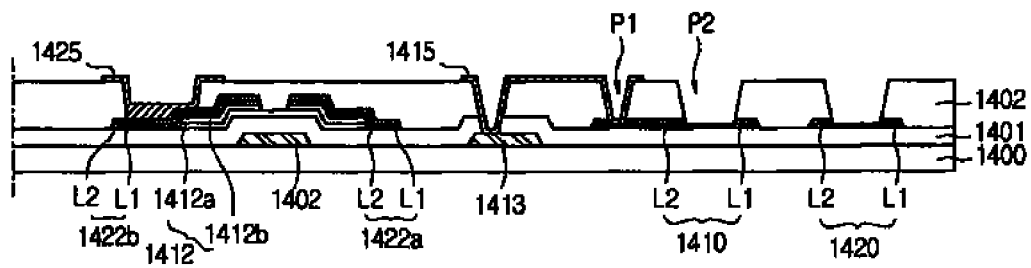

Referring to FIG. 8C, a conductive material is deposited on the passivation layer 1402 including the contact holes. The deposited conductive material is patterned to form a link line 1415 for electrically connecting the gate pad link portion 1413 to the gate pad 1410. Also, because the drain electrode 1422b can be lost during the process for forming the contact holes, a connection electrode 1425 for compensating for this loss can be further formed.

Figure 8D:
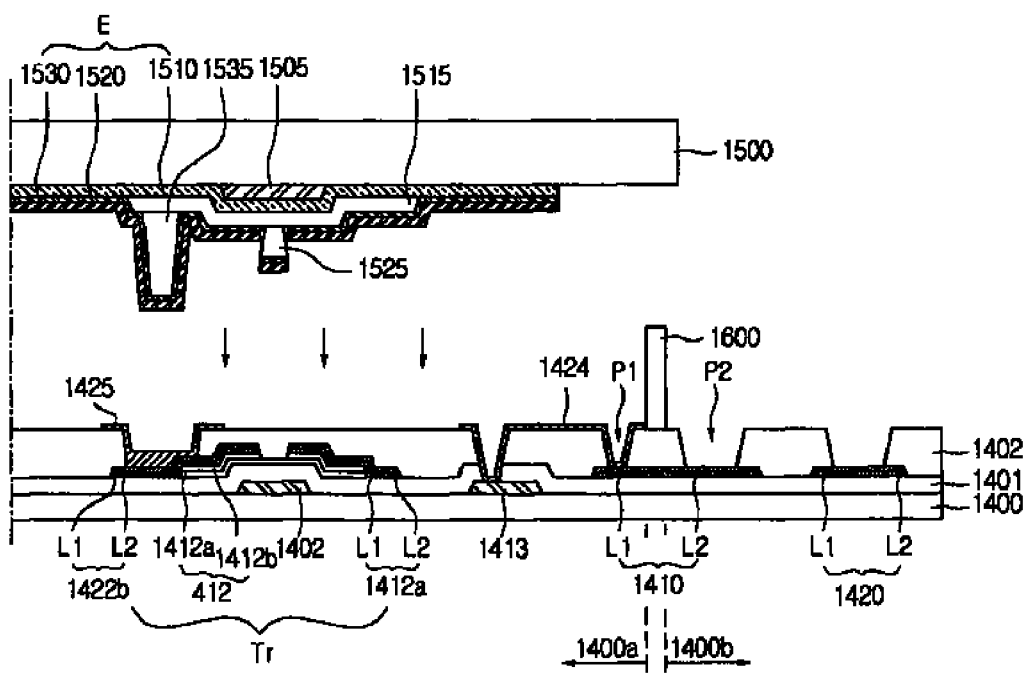

Referring to FIG. 8D, after sealant patterns 1600 are formed on the first substrate 1400 including the TFT or the second substrate 1500 including the organic light-emitting diode device E, an encapsulating process for attaching the two substrates to each other is performed, so that an organic electro-luminescence display device is manufactured.

As described above, an organic electro-luminescence display device can be manufactured by forming TFTs and organic light-emitting diode devices on different two substrates, respectively, and attaching the two substrates to each other, so that a defect rate reduction and production yield can be improved.

Also, a pad portion exposed to the outside is formed of a conductive material having strong corrosion resistance, so that corrosion of the pad portion can be prevented.

Also, because the corrosion of the pad portion can be prevented, a defect problem caused by the corrosion of the pad portion can be solved, and reliability can improve.

Also, because a pad portion having corrosion resistance can be simultaneously formed, a separate process is not required.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro-luminescence display device comprising:
    a first substrate having a first region and a second region defined thereon;
    a gate line formed on a portion of the first substrate that corresponds to the first region, and a gate pad extending from the gate line and formed on the second region;
    a data pad extending to the first and second regions of the first substrate;
    a gate insulating layer formed on the gate line, the gate pad, and the data pad;
    a data line disposed on the gate insulating layer and crossing the gate line, and a data pad link portion located at an end of the data line;
    at least one thin film transistor formed on an intersection of the gate line and the data line;
    a passivation layer including a contact hole exposing portions of the thin film transistor, the data pad, the gate pad, and the data pad link portion;
    a link line disposed on the passivation layer to electrically connect the data pad with the data pad link portion;
    a second substrate spaced a predetermined distance from the first substrate and attached to the first substrate using sealant patterns;
    an organic light-emitting diode device, which is comprising of a first electrode, an organic light-emitting layer and a second electrode, formed on an inner surface of the second substrate;
    an auxiliary electrode formed on a portion on which an image is not displayed between the second substrate and the first electrode, and
    sealant patterns formed on an interface between the first region and the second region,
    wherein the link line is arranged to an inner side of a region of the sealant patterns,
    wherein the data pad link portion have a plurality of layers in which the same material as those of a source/drain electrode of the thin film transistor.

2. The organic electro-luminescence display device according to claim 1, wherein the data pad is formed by stacking first conductive patterns and second conductive patterns, and the first conductive patterns are formed of a conductive material having corrosion resistance.

3. The organic electro-luminescence display device according to claim 2, wherein the first conductive patterns are formed of one of an indium tin oxide and an indium zinc oxide.

4. The organic electro-luminescence display device according to claim 2, wherein the first conductive patterns have a first resistance and the second conductive patterns have a second resistance less than the first resistance of the first conductive patterns.

5. The organic electro-luminescence display device according to claim 2, wherein the second conductive patterns are formed of one of Mo and Cr.

6. The organic electro-luminescence display device according to claim 2, wherein the data pad comprises the first conductive patterns formed on the second conductive patterns.

7. The organic electro-luminescence display device according to claim 2, wherein the data pad comprises the second conductive patterns formed on the first conductive patterns, and the second conductive patterns comprises an opening exposing a portion of the first conductive patterns.

8. The organic electro-luminescence display device according to claim 1, wherein the gate pad is formed of the same conductive material as that of the data pad.

9. The organic electro-luminescence display device according to claim 1, further comprising a buffer layer defining a pixel region is disposed below the first electrode; and
a separator and a spacer spaced a predetermined distance from the separator are disposed under buffer layer, and
wherein the auxiliary electrode formed on a portion on which the separator is provide.

10. The organic electro-luminescence display device according to claim 1, further comprising a connection electrode formed of the same conductive material as that of the link line, and connected to a portion of the thin film transistor exposed via the contact hole.

11. An organic electro-luminescence display device comprising:
a first substrate;
a data pad formed by stacking at least first conductive patterns and second conductive patterns on the first substrate;
a gate insulating layer formed on the data pad;
a data pad link portion formed on the gate insulating layer;
a passivation layer formed on the data pad link portion and having a contact hole exposing a portion of the data pad link portion;
a link line located on the passivation layer to electrically connect the data pad link portion with the data pad,
a second substrate spaced a predetermined distance from the first substrate and attached to the first substrate using sealant patterns;
an organic light-emitting diode device, which is comprising of a first electrode, an organic light-emitting layer and a second electrode, formed on an inner surface of the second substrate;
an auxiliary electrode formed on a portion on which an image is not displayed between the second substrate and the first electrode, and
wherein the link line is arranged to an inner side of a region of the sealant patterns,
wherein the first conductive patterns are formed of a conductive material having corrosion resistance,
wherein the data pad link portion have a plurality of layers in which the same material as those of a source/drain electrode of the thin film transistor, a channel pattern and an ohmic contact layer are sequentially stacked.

12. The organic electro-luminescence display device according to claim 11, wherein the first conductive patterns are formed of one of indium tin oxide and indium zinc oxide.

13. The organic electro-luminescence display device according to claim 11, wherein the first conductive patterns have a first resistance and the second conductive patterns have a second resistance less than the first resistance of the first conductive patterns.

14. The organic electro-luminescence display device according to claim 11, wherein the second conductive patterns are formed of one of Mo and Cr.

15. The organic electro-luminescence display device according to claim 11, further comprising:
a gate line formed of the same conductive material as that of the data pad on the gate insulating layer; and
a gate pad extending from the gate line.

16. The organic electro-luminescence display device according to claim 11, wherein the data pad comprises the first conductive patterns formed on the second conductive patterns.

17. The organic electro-luminescence display device according to claim 11, wherein the data pad comprises the second conductive patterns formed on the second conductive patterns, and the first conductive patterns comprises an opening exposing a portion of the first conductive patterns.

18. The organic electro-luminescence display device according to claim 11, wherein the sealant patterns formed on an interface between the first region and the second region.

19. The organic electro-luminescence display device according to claim 11, further comprising a buffer layer defining a pixel region is disposed below the first electrode; and
a separator and a spacer spaced a predetermined distance from the separator are disposed under buffer layer, and
wherein the auxiliary electrode formed on a portion on which the separator is provide.

20. The organic electro-luminescence display device according to claim 11, further comprising a connection electrode formed of the same conductive material as that of the link line, and connected to a portion of the thin film transistor exposed via the contact hole.

21. An organic electro-luminescence display device comprising:
a first substrate;
a gate line located on the first substrate, and a gate pad link portion formed at an end of the gate line;
a gate insulating layer formed on the first substrate including the gate line and the gate pad link portion;
a data line formed by stacking at least first conductive patterns and second conductive patterns on the gate insulating layer, a data pad located at an end of the data line, and a gate pad separated from the data line;
a passivation layer formed on the data line, the data pad, and the gate pad, and including a contact hole exposing portions of the gate pad link portion, the data pad, and the gate pad; and
a link line located on the passivation layer to electrically connect the gate pad link portion with the gate pad;
a second substrate spaced a predetermined distance from the first substrate and attached to the first substrate using sealant patterns;
an organic light-emitting diode device, which is comprising of a first electrode, an organic light-emitting layer and a second electrode, formed on an inner surface of the second substrate; and
an auxiliary electrode formed on a portion on which an image is not displayed between the second substrate and the first electrode, and
wherein the first conductive patterns are formed of a conductive material having corrosion resistance, wherein the gate pad is formed on the gate insulating layer, wherein the gatepad and the data pad are formed of the same material.

22. The organic electro-luminescence display device according to claim 21, wherein the first conductive patterns are formed of one of an indium tin oxide and an indium zinc oxide.

23. The organic electro-luminescence display device according to claim 21, wherein the second conductive patterns are formed of a conductive material of a low resistor having lower resistance than that of the first conductive patterns.

24. The organic electro-luminescence display device according to claim 21, wherein the second conductive patterns are formed of one of Mo and Cr.

25. The organic electro-luminescence display device according to claim 21, wherein the data pad comprises the first conductive patterns formed on the second conductive patterns.

26. The organic electro-luminescence display device according to claim 21, wherein the data pad comprises the second conductive patterns formed on the second conductive patterns, and the first conductive patterns comprises an opening exposing a portion of the first conductive patterns.

27. The organic electro-luminescence display device according to claim 21, wherein the gate line and the data line are formed to cross each other, and a thin film transistor formed on a portion where the gate line and the data line cross each other is further provided.

28. The organic electro-luminescence display device according to claim 27, further comprising a connection electrode formed of the same conductive material as that of the link line and electrically connected to a drain electrode of the thin film transistor.

29. The organic electro-luminescence display device according to claim 21, wherein the sealant patterns formed on an interface between the first region and the second region.

30. The organic electro-luminescence display device according to claim 29, wherein the link line is formed on an inner side of a region that corresponds to the second substrate and where the sealant patterns are formed.

31. The organic electro-luminescence display device according to claim 21, further comprising a buffer layer defining a pixel region is disposed below the first electrode; and
 a separator and a spacer spaced a predetermined distance from the separator are disposed under buffer layer, and wherein the auxiliary electrode formed on a portion on which the separator is provide.

32. The organic electro-luminescence display device according to claim 21, further comprising:
 a power line located on the first substrate and formed in parallel to the gate line; and
 a ground pad link portion located at an end of the power line.

33. The organic electro-luminescence display device according to claim 32, further comprising a ground pad located on the gate insulating layer and electrically connected to the ground pad link portion.

* * * * *